May 30, 1961 S. KAGAN ET AL 2,986,657

PULSE GENERATOR

Filed July 1, 1958

SHOLLY KAGAN
JOHN E. OLBRYCH
INVENTORS

BY Alden D Redfield
Abraham Ogman
ATTORNEYS

United States Patent Office 2,986,657

Patented May 30, 1961

2,986,657

PULSE GENERATOR

Sholly Kagan, Boston, and John E. Olbrych, Salem, Mass., assignors to Avco Manufacturing Corporation, Cincinnati, Ohio, a corporation of Delaware Filed July 1, 1958, Ser. No. 745,877

14 Claims. (Cl. 307—88.5)

Figure 2:
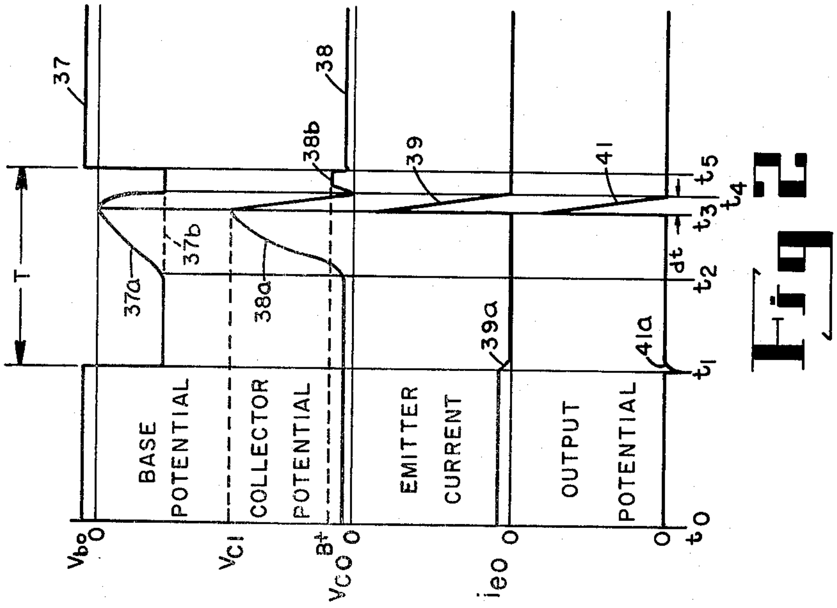

This invention relates to a pulse generator which makes use of the avalanche phenomenon found in certain transistors for producing an extremely narrow pulse with substantial power capabilities.

The production of extremely narrow pulses, in the order of magnitude of 10 millimicroseconds has always been a difficult matter. Additionally, to produce these pulses at high repetition rates and at high power levels involved the use of numerous complex circuits and devices.

Recent attempts to solve the problem have involved the avalanche phenomenon found in certain transistors. An excellent discussion of avalanche pulse generators is found in the Beale et al. article found in the July 1957 issue of the Proceedings of the Institute of Electrical Engineers (London) at page 394. Briefly considered, when certain transistors have a high voltage applied to their collectors while the transistors are in a nonconducting state, an avalanche conduction is initiated. Under avalanche conditions, the collector impedance is virtually reduced to zero and there exists between the collector and the emitter the extremely small emitter impedance. As a result, the transistor conducts heavily. After the transistor avalanches, the control over the current therein, normally exercised by the base bias, no longer exists and the transistor continues in an avalanche state as long as a minimum current flows therein.

In the past, avalanche pulse generators operated as RC relaxation type pulse generators. This type of circuit has several material limitations. In the first place where the circuit is designed to emit a high powered pulse, it is found that the repetition rates are limited, in the order of 100,000 pulses per second. On the other hand, when a circuit is designed to provide a high repetition rate, in the order of two megacycles per second, it is found that it is impossible to obtain an output pulse having high power capabilities. A second very serious limitation in the use of avalanche RC relaxation pulse generators, is the necessity for providing a high powered trigger source to initiate the avalanche. Finally, it has been determined that in the avalanche RC relaxation pulse generator the collector supply voltage must exceed the voltage required to make the transistor avalanche.

It is an object of the invention to provide a new and improved avalanche pulse generator which overcomes one or more of the above mentioned disadvantages and limitations of prior avalanche pulse generators.

It is another object of the invention to provide a new and improved pulse generator which can provide a high powered, extremely narrow output pulse, at high repetition rates.

It is still another object of the invention to provide a new and improved avalanche pulse generator which is capable of being triggered from a low powered driving source.

It is still another object of the invention to provide a new and improved avalanche pulse generator having storage means for providing electrical energy for initiating and maintaining an avalanche current in a transistor.

Finally, it is an object of the invention to provide an avalanche pulse generator having an inductance for initiating the avalanche and a capacitor for maintaining it, the inductance and capacitance being coupled to the collector of the transistor.

In accordance with the present invention there is provided a pulse generator which comprises a normally conducting transistor. The pulse generator also includes means for terminating current flow in the transistor. Finally, the pulse generator includes storage means in the current path of the collector and connected thereto. The storage means is responsive to the termination of the current flow in the collector for developing and applying a voltage to the collector, which voltage is of sufficient magnitude and of correct polarity to cause the transistor to avalanche. Means are provided for obtaining from the pulse generator an output pulse having an extremely short duration and substantial power.

Figure 1:
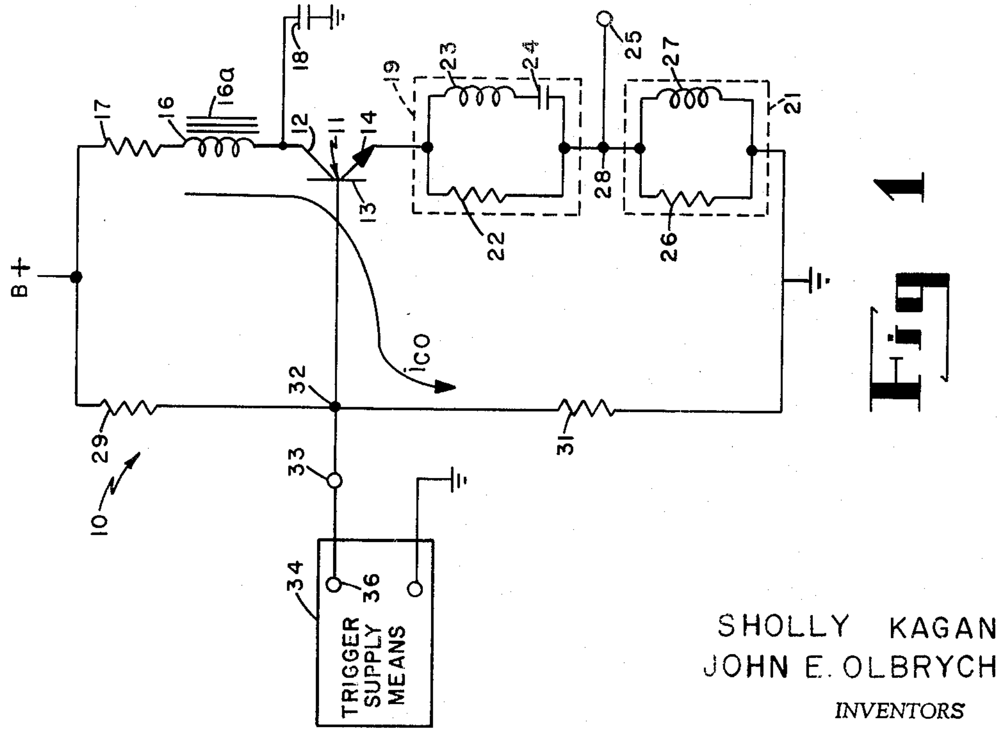

The novel features that we consider characteristic of our invention are set forth in the appended claims; the invention itself, however, both as to its organization and method of operation, together with additional objects and advantages thereof, will best be understood from the following description of a specific embodiment when read in conjunction with the accompanying drawings, in which:

Fig. 1 is a schematic circuit diagram of a pulse generator embodying the principles of the present invention, and Fig. 2 includes curves useful in describing the operation of the circuit shown in Fig. 1.

*Description of the pulse generator*

Referring to Fig. 1 of the drawings there is shown a schematic circuit diagram of a pulse generator, constructed in accordance with the present invention for supplying a high powered extremely narrow pulse signal. The pulse generator generally identified 10 includes a transistor 11 comprising a collector electrode 12, a base electrode 13 and an emitter electrode 14. The transistor is preferably a commercial type designated as a 2N385 or a 2N388. These commercial transistors have been found to have avalanche characteristics which are particularly useful in the circuit to be described. They are, however, by no means to be considered exhaustive of the commercially available transistors which may be used in the circuit. An inductance 16, assumed to have a negligible resistance, is connected in series with resistor 17 between the collector 12 and a voltage supply means identified by B+. Inductance 16, preferably includes an iron or magnetic core 16*a*, to provide the maximum magnetic flux for a given magnetizing current. A capacitor 18 is connected from the collector 12 to ground.

The emitter is coupled to ground through a pair of cascaded networks 19 and 21. Network 19 comprises a resistor 22 in parallel with the series combination of an inductance 23 and a capacitor 24. Resistor 22 is a degenerative element, found in most transistor circuits, to prevent the transistor 11 from destroying itself when the reverse collector current increases due to temperature changes. Inductance 23 and capacitor 24 form a series resonant circuit which acts to shunt resistor 22 in the region of its resonant frequency. On the other hand, for D.C. or low frequencies the series combination of inductance 23 and capacitor 24 is a high capacitive impedance and does not shunt resistor 26.

Network 21 comprises a resistor 26 in parallel with an inductance 27. Resistor 26 represents the load impedance of the pulse generator 10, while inductance 27 is assumed to have a low resistance and bypasses D.C. and low frequency currents around resistor 26. Resistor 26 although shown solely as part of pulse generator 10 may include the input impedance of a following stage. An output terminal 25 is coupled to the junction 28 between networks 19 and 21.

Connected between B+ and ground is a voltage divider network comprising resistors 29 and 31. The base 13 is coupled to an input terminal 33 through a junction 32 between resistors 29 and 31. The potential at junction 32 biases transistor 11 into a quiescent class A conduction, and the input terminal 33 provides circuit means for supplying a trigger signal to pulse generator 10.

A trigger supply means 34 is provided for controlling the operation of the pulse generator 10. An output terminal 36 of the trigger supply means 34 is coupled to the input terminal 33 of the pulse generator. Trigger supply means 34 may be a blocking oscillator, or multivibrator, or one of the numerous other forms of pulse generators well known to persons skilled in the art. For reasons to be stated hereafter the trigger supply means 34 need not be capable of providing a high powered pulse.

*Operation of pulse generator circuit*

The operation of the Fig. 1 pulse generator will be discussed in conjunction with the curves represented in Fig. 2, of the drawings. Curve 37 represents the voltage appearing at the base 13, as a function of time. Curves 38, 39, and 41 represent the collector potential, the emitter current, and the output potential respectively, as a function of time.

At the outset, at time $t_0$, the transistor 11 is conducting in a quiescent class A state. At this time, the base potential equals some positive value $V_{bo}$, the collector potential, due to the negligible resistance of inductance 16, is at $V_{co}$, reflecting only the drop in resistor 17. A class A or D.C. current $i_{eo}$ is flowing in the emitter 13. There is no output voltage at this time since, as previously explained, inductance 27 bypasses resistor 26 in D.C. or class A operation.

The class A current in inductance 16 produces a magnetic field therein, which as is well known, stores electrical energy. At some subsequent time, $t_1$ for example, a negative trigger signal, preferably a rectangular pulse **37*b*, is applied to the base 13 from the trigger supply means 34. The duration T of the trigger signal 37*b* is quite long providing ample time for the pulse generator to operate. The amplitude of the negative trigger signal is sufficient to overcome the positive bias on the base 13 and the current flow in transistor 11 is terminated. The emitter current tends to fall to zero. It is well known that an inductance, in this case inductance 27, in a current path prevents the current flowing therein from changing instantaneously. Therefore, as illustrated by curve 39*a*, the emitter current is prevented from dropping sharply to zero. A small negative voltage appears at the output terminal 25 at this time. This voltage 41*a* is caused by the transition of the emitter current, from $L_{co}$ to zero. As will be shown hereafter its magnitude is proportional to the rate of change of current in inductance 27 and since the transition is slow, the voltage 41*a*** is small.

As is well known, the magnetic field, created by the class A current flowing in inductance 16, starts to collapse when the current flowing therein tends to stop flowing. However, since the current in an inductor can not change instantaneously, a large voltage is induced at the collector 12 of the transistor 11 and is of the value indicated by the following equation:

$$E=L\frac{di}{dt}$$

where $L$=the inductance of inductance 16

$di/dt$=the rate of change of current in inductance 16 accompanying the collapsing magnetic field.

At time $t_2$ the voltage on the collector 12 produced by the induced voltage starts to rise and thereafter rises substantially sinusoidally as shown at **38*a*. The increase in collector potential also causes the voltage across capacitor 18 to rise. In effect there is a transfer of energy from inductance 16 to capacitor 18. As the voltage on collector 12 rises, there begins to flow in the collector 12 and base 13 circuits a reverse current designated as $i_{co}$. The direction of current flow is from the collector 12 to the base 13 as shown by the arrow in Fig. 1. This current develops a voltage across resistor 31 which is in opposition to the applied trigger signal, and the base potential rises as at 37*a*. When the potential at the collector 12 reaches the value $V_{cl}$, at time $t_3$, the negative bias established by the trigger signal is neutralized by the voltage created by $i_{co}$ in resistor 31. The combination of zero bias and high collector potential causes the transitsor 11 to avalanche, and to pass a high current in the emitter circuit as shown in curve 39. The avalanche current is primarily derived from energy stored in capacitor 18. There is some contribution however, from the residue of the energy in the collapsing magnetic field and the current originating from the B+ supply, but these are limited by the resistor 17**.

It will be recalled that when transistor 11 avalanches the collector 12 impedance is virtually zero and the transistor avalanche impedance is reduced to the forward impedance of the emitter 14. Also included in the avalanche current path and limiting the current are networks 19 and 21 in the emitter 14 circuit. The impedance of network 19 may be neglected because at the avalanche frequencies, 100 megacycles for example, the inductance 23 and capacitor 24 become series resonant and constitute an extremely small impedance, which may be neglected, across resistor 22. The peak value of the avalanche current is therefore limited by the transistor 11 avalanche impedance and the impedance of network 21, which at avalanche frequencies is equal to the resistance of resistor 26, since the impedance of inductance 27 is extremely high at these frequencies.

The output voltage developed across resistor 26 and available at output terminal 25 is proportional to the emitter current and it takes the form thereof as shown in curve 41. Its magnitude is determined by the relative impedance values between resistor 26 and the avalanche impedance of the transistor 11. Clearly, therefore the output voltage will depend largely upon the characteristics of the transistor used. As will be shown in circuit constants listed hereinafter, in one application, the ratio of the transistor impedance to the resistance of resistor 26 may be 3 to 1 and consequently 25% of the peak voltage in capacitor 18, at the time the avalanche was initiated, was developed across resistor 26 as the peak amplitude of the output pulse.

The time constant established by capacitor 18 and the impedances of transistor 11 in series with resistor 26 is extremely small and the capacitor 18 is discharged very rapidly, in the interval $dt$ for example. After capacitor 18 is fully discharged, the B+ supply attempts to continue current flow in transistor 11 for maintaining the avalanche active. However, the resistor 17, in series with the collector 12 with the B+ supply, limits this current to a value below the minimum value required for maintaining the avalanche active and the avalanche terminates at time $t_4$. Referring to curve 37 it is seen that at time $t_4$, the base potential is negative, due to continued presence of the trigger signal **37*b* on the base 13, thereby biasing the transistor 11 to cut off. Accordingly, the emitter current remains at zero and the collector potential returns to B+, as at 38*b*. At time $t_5$ the trigger signal shown in curve 37*b* crosses the zero axis and goes positive. At this time the transistor 11** begins to conduct under class A conditions and the original operating conditions are established.

Several important considerations stem from the aforementioned operation of the Fig. 1 pulse generator. It would be noted that the operation of the pulse generator 10 is controlled at the base 13, and therefore does not require a high powered signal from the trigger supply means 34. In addition, because the impedance of the transistor 13 drops to a low value during the avalanche operation, it is possible to develop large output pulses at low impedance. The combination results in a high powered output signal. Finally, the charge and discharge time constants for capacitor 18 may be made extremely small to enable the circuit to operate at high repetition frequencies. It has been determined that the operating characteristics, the repetition rate, and the power output for example, are primarily limited by the temperature limitations of the transistor used.

While the invention is not limited to any particular design constants, the following values are representative for the elements of the pulse generator circuit of Fig. 1, it being understood that the exact values of these components are dependent on the characteristics of the particular transistor used.

| | |
|---|---|
| Transistor | 2N385 or 2N388 |
| Transistor avalanche impedance ohms | 150 |
| Inductance 16 microhenries | 118 |
| Inductance 25 do | 1.4 |
| Inductance 27 do | 15 |
| Capacitor 18 micromicrofarads | 10 |
| Capacitor 24 do | 110 |
| Resistor 17 ohms | 150 |
| Resistor 22 do | 82 |
| Resistor 25 do | 50 |
| Resistor 29 do | 8200 |
| Resistor 31 do | 470 |
| Pulse duration millimicroseconds | 10 |
| Avalanche potential ($V_{cl}$) volts | 40 |
| Trigger amplitude do | 6 |
| Output pulse amplitude do | 10 |
| Repetition rate megacycles | 2.5 |
| Peak power output across 50 ohm load watts | 2 |

The various features and advantages of the invention are thought to be clear from the foregoing description. Various other features and advantages not specifically enumerated will undoubtedly occur to those versed in the art, as likewise will many variations and modifications of the preferred embodiment illustrated, all of which may be achieved without departing from the spirit and scope of the invention as defined by the following claims:

We claim:

1. A pulse generator comprising a transistor having at least a base electrode, a collector electrode and an emitter electrode, said transistor being adapted to avalanche and to conduct in a reverse direction from said collector electrode to said base electrode, circuit means for biasing said transistor into conduction, a portion of said circuit means being in the current path of the reverse current, a trigger supply means for supplying a signal to said circuit means for cutting off said transistor and initiating the reverse current, a first storage means coupled to said collector electrode for storing electrical energy during the transistor conduction period and for giving up its stored energy when the transistor is cut off, a portion of the stored energy being used to increase the voltage on said collector electrode and to increase the reverse current to initiate avalanche conduction in said transistor, a second storage means for accumulating another portion of the stored energy given up by said first storage means and then giving up its stored energy to maintain the avalanche conduction, and means, in the current path of said emitter electrode, responsive to the avalanche current therein for developing an output signal.

2. A pulse generator comprising a source of supply voltage, a transistor having at least a base electrode, a collector electrode and an emitter electrode, said transistor being adapted to avalanche and to conduct in a reverse direction from said collector electrode to said base electrode, circuit means comprising a pair of cascaded resistors coupled to said supply voltage and said base electrode for biasing said transistor into conduction, one of said resistors being in the current path of the reverse current, a trigger supply means coupled to said base electrode and said circuit means for developing a signal across said one resistor for cutting off said transistor and initiating the flow of reverse current, an inductance in series with said collector electrode for storing electrical energy during the transistor conduction period and for giving up its stored energy when said transistor is cut off, a portion of said stored energy being used to increase the voltage on said collector electrode and to increase the reverse current to initiate avalanche conduction in said transistor, a capacitor coupled to said inductance and said collector electrode for accumulating another portion of the stored energy given up by said inductance and then giving up its accumulated stored energy to maintain the avalanche conduction, current limiting means comprising a resistor in the current path of said transistor for limiting the current flowing in said transistor during the conduction period and for terminating the avalanche conduction when the stored and accumulated energy are dissipated, means in parallel with at least a portion of said current limiting means for bypassing the avalanche current around said portion of said current limiting means, and a network in the current path of said emitter electrode comprising a load resistor in parallel with a second inductance, said load resistor being responsive to the avalanche current flowing in the emitter electrode for developing an output signal, said second inductance bypassing direct current and low frequency components of the emitter current around said load resistor thereby preventing the direct current and low frequency components from developing an output signal.

3. A pulse generator comprising a source of supply voltage, a transistor having at least a base electrode, a collector electrode and an emitter electrode, said transistor being adapted to avalanche and to conduct in a reverse direction from said collector electrode to said base electrode, circuit means comprising a pair of cascaded resistors coupled to said supply voltage and said base electrode for biasing said transistor into conduction, one of said resistors being in the current path of the reverse current, an input terminal coupled to said base and circuit means, a trigger supply means coupled to said base electrode and said circuit means through said input terminal for developing a signal across said one resistor for cutting off said transistor and initiating the flow of reverse current, an inductance in series with said collector electrode for storing electrical energy during the transistor conduction period and for giving up its stored energy when the transistor is cut off, a portion of said stored energy being used to increase the voltage on said collector electrode and to increase the reverse current in said one resistor to initiate avalanche conduction in said transistor, a capacitor coupled to said inductance and said collector electrode for accumulating another portion of the stored energy given up by said inductance and then giving up its accumulated energy to maintain the avalanche conduction, current limiting means comprising a resistor in the current path of said transistor for limiting the current flowing in said transistor during the conduction period and for terminating the avalanche conduction when the accumulated and stored energy are dissipated, means comprising a series tuned circuit in parallel with at least a portion of said current limiting means for bypassing the avalanche current around said portion of said current limiting means, and a network in the current path of said emitter electrode comprising a load resistor in parallel with a second inductance, said load resistor being responsive to the avalanche current flowing in the emitter electrode for developing an output signal, said second inductance bypassing direct current and low frequency components of the emitter current around said load resistor thereby preventing the direct current and low frequency components from developing an output signal.

4. A pulse generator comprising a normally conducting transistor, said transistor being adapted to avalanche, circuit means for supplying a signal for cutting off said transistor, storage means for storing electrical energy during the transistor conduction period, said storage means giving up its stored energy when said transistor is cut off thereby initiating and maintaining avalanche conduction in said transistor, and means responsive to the avalanche current for developing an output signal.

5. A pulse generator comprising a normally conducting transistor having at least an emitter electrode, said transistor being adapted to avalanche, circuit means for supplying a signal for cutting off said transistor, storage means for storing electrical energy during the transistor conduction period, said storage means giving up its stored energy when said transistor is cut off thereby initiating and maintaining avalanche conduction in said transistor, and means, in the current path of said emitter electrode, responsive to the avalanche current therein for developing an output signal.

6. A pulse generator comprising a normally conducting transistor said transistor being adapted to avalanche, circuit means for supplying a signal for cutting off said transistor, storage means for storing electrical energy in a magnetic field during the transistor conduction period, the magnetic field collapsing and giving up the stored energy therein when said transistor is cut off thereby initiating and maintaining avalanche conduction in said transistor, and means responsive to the avalanche current for developing an output signal.

7. A pulse generator comprising a normally conducting transistor having at least a collector electrode and an emitter electrode, said transistor being adapted to avalanche, circuit means for supplying a signal for cutting off said transistor, storage means coupled to said collector electrode for storing electrical energy during the transistor conduction period, said storage means giving up its stored energy when said transistor is cut off thereby first developing a potential at said collector electrode for initiating the avalanche conduction in said transistor, and then maintaining it, and means, in the current path of said emitter electrode, responsive to the avalanche current therein for developing an output signal.

8. A pulse generator comprising a normally conducting transistor, said transistor being adapted to avalanche, circuit means for supplying a signal for cutting off said transistor, a first storage means for storing electrical energy during the transistor conduction period, said first storage means giving up its stored energy when said transistor is cut off, a portion of the stored energy being used to initiate avalanche conduction in said transistor, a second storage means for accumulating another portion of the stored energy given up by said first storage means and then giving up its accumulated energy to maintain the avalanche conduction, and means responsive to the avalanche current for developing an output signal.

9. A pulse generator comprising a normally conducting transistor having at least an emitter electrode, said transistor being adapted to avalanche, circuit means for supplying a signal for cutting off said transistor, a first storage means for storing electrical energy during the transistor conduction period, said first storage means giving up its stored energy when said transistor is cut off, a portion of the stored energy being used to initiate avalanche conduction in said transistor, a second storage means for accumulating another portion of the stored energy given up by said first storage means and then giving up its accumulated energy to maintain the avalanche conduction, and means, in the current path of said emitter electrode, responsive to the avalanche current therein for developing an output signal.

10. A pulse generator comprising a normally conducting transistor having at least a collector electrode, said transistor being adapted to avalanche, circuit means for supplying a signal for cutting off said transistor, a first storage means coupled to said collector electrode for storing electrical energy during the transistor conduction period, said first storage means giving up its stored energy when said transistor is cut off, a portion of the stored energy being used to increase the potential at said collector electrode to initiate avalanche conduction in said transistor, a second storage means for accumulating another portion of the stored energy given up by said first storage means and then giving up its accumulated energy to maintain the avalanche conduction, and means responsive to the avalanche current for developing an output signal.

11. A pulse generator comprising a normally conducting transistor having at least a collector electrode and an emitter electrode, said transistor being adapted to avalanche, circuit means for supplying a signal for cutting off said transistor, a first storage means for storing electrical energy during the transistor conduction period, said first storage means giving up its stored energy when said transistor is cut off, a portion of the stored energy being used to initiate avalanche conduction in said transistor, a capacitor coupled to said collector electrode for accumulating another portion of the stored energy given up by said first storage means and then giving up its accumulated energy to maintain the avalanche conduction, and means, in the current path of said emitter electrode, responsive to the avalanche current therein for developing an output signal.

12. A pulse generator comprising a normally conducting transistor, said transistor being adapted to avalanche, circuit means for supplying a signal for cutting off said transistor, inductive means for storing electrical energy in a magnetic field during the transistor conduction period, the magnetic field collapsing and giving up the stored energy therein when said transistor is cut off, a portion of the stored energy being used to initiate avalanche conduction in said transistor, a second storage means for accumulating another portion of the stored energy given up by said inductive means and then giving up its accumulated energy to maintain the avalanche conduction, and means responsive to the avalanche current for developing an output signal.

13. A pulse generator comprising a normally conducting transistor having at least a collector electrode and an emitter electrode, said transistor being adapted to avalanche, circuit means for supplying a signal for cutting off said transistor, an inductance in the current path of said collector electrode for storing electrical energy during the transistor conduction period, said inductance giving up its stored energy when said transistor is cut off, a portion of the stored energy being used to increase the potential at said collector electrode to initiate avalanche conduction in said transistor, a capacitor coupled to said collector electrode and said inductance for accumulating another portion of the stored energy given up by said inductance and then giving up its accumulated energy to maintain the avalanche conduction, and means, in the current path of said emitter electrode, responsive to the avalanche current therein for developing an output signal.

14. A pulse generator comprising a normally conducting transistor having at least a collector electrode, said transistor being adapted to avalanche, circuit means for supplying a signal for cutting off said transistor, a first storage means coupled to said collector electrode for storing electrical energy during the transistor conduction period, said first storage means giving up its stored energy when said transistor is cut off, a portion of the stored energy being used to increase the potential of said collector electrode and to oppose the supplied signal to initiate avalanche conduction in said transistor, a second storage means for accumulating another portion of the stored energy given up by said first storage means and then giving up its accumulated energy to maintain the avalanche conduction, and means responsive to the avalanche current for developing an output signal.

References Cited in the file of this patent

UNITED STATES PATENTS

| | | |
|---|---|---|
| 2,750,508 | Waldhauer | June 12, 1956 |
| 2,797,327 | Kidd | June 25, 1957 |
| 2,811,643 | Eberhard | Oct. 29, 1957 |
| 2,811,646 | Yin | Oct. 29, 1957 |
| 2,820,145 | Wolfendale | Jan. 14, 1958 |
| 2,841,703 | Bopp et al. | July 1, 1958 |
| 2,889,460 | Ehret | June 2, 1959 |
| 2,902,655 | Jones et al. | Sept. 1, 1959 |